United States Patent
Milde et al.

(10) Patent No.: US 8,197,222 B2
(45) Date of Patent: Jun. 12, 2012

(54) GETTER PUMP AND VACUUM COATING INSTALLATION COMPRISING A GETTER PUMP

(75) Inventors: Falk Milde, Dresden (DE); Hans-Christian Hecht, Weinboehla (DE); Joern Brueckner, Langebrueck (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 617 days.

(21) Appl. No.: 12/306,956

(22) PCT Filed: Jul. 4, 2007

(86) PCT No.: PCT/EP2007/056773
§ 371 (c)(1),
(2), (4) Date: Apr. 24, 2009

(87) PCT Pub. No.: WO2008/003724
PCT Pub. Date: Jan. 10, 2008

(65) Prior Publication Data
US 2009/0202362 A1 Aug. 13, 2009

(30) Foreign Application Priority Data
Jul. 5, 2006 (DE) .......................... 10 2006 031 440

(51) Int. Cl.
*F04B 37/02* (2006.01)
(52) U.S. Cl. ................. 417/51; 417/48; 417/49; 417/50
(58) Field of Classification Search ............... 417/48, 417/49, 51, 50
See application file for complete search history.

(56) References Cited

U.S. PATENT DOCUMENTS

| 3,662,522 A | 5/1972 | Della Porta et al. |
| 5,980,213 A | 11/1999 | Krueger et al. |
| 6,109,880 A * | 8/2000 | Krueger et al. ................. 417/48 |
| 6,142,742 A * | 11/2000 | Krueger et al. ................. 417/48 |
| 2007/0286738 A1* | 12/2007 | Lukens ........................... 417/49 |

FOREIGN PATENT DOCUMENTS

| JP | 60 222572 A | 11/1985 |
| JP | 7138739 A | 5/1995 |
| JP | 2001 234326 A | 8/2001 |

OTHER PUBLICATIONS

International Search Report for PCT/EP2007/056773 dated Dec. 7, 2007.

* cited by examiner

*Primary Examiner* — Peter Macchiarolo
*Assistant Examiner* — Thomas A Hollweg
(74) *Attorney, Agent, or Firm* — Heslin Rothenberg Farley & Mesiti P.C.

(57) ABSTRACT

A highly efficient getter pump with low maintenance requirements is applied to a vacuum coating installation, allowing a substrate to be coated to remain uncontaminated by a dusting of getter material. The getter pump comprises a pump housing with an exposure opening. The housing has a getter body, of getter material that essentially closes the exposure opening and can move in relation to the exposure opening. An inner sub-section of the surface of the getter body points towards the interior of the pump housing and an outer sub-section points towards the exterior of the pump housing through the exposure opening. The positions of the inner and outer sub-sections are interchangeable by movement of the getter body. The getter pump is equipped with a device for removing getter material from the inner sub-section.

14 Claims, 1 Drawing Sheet

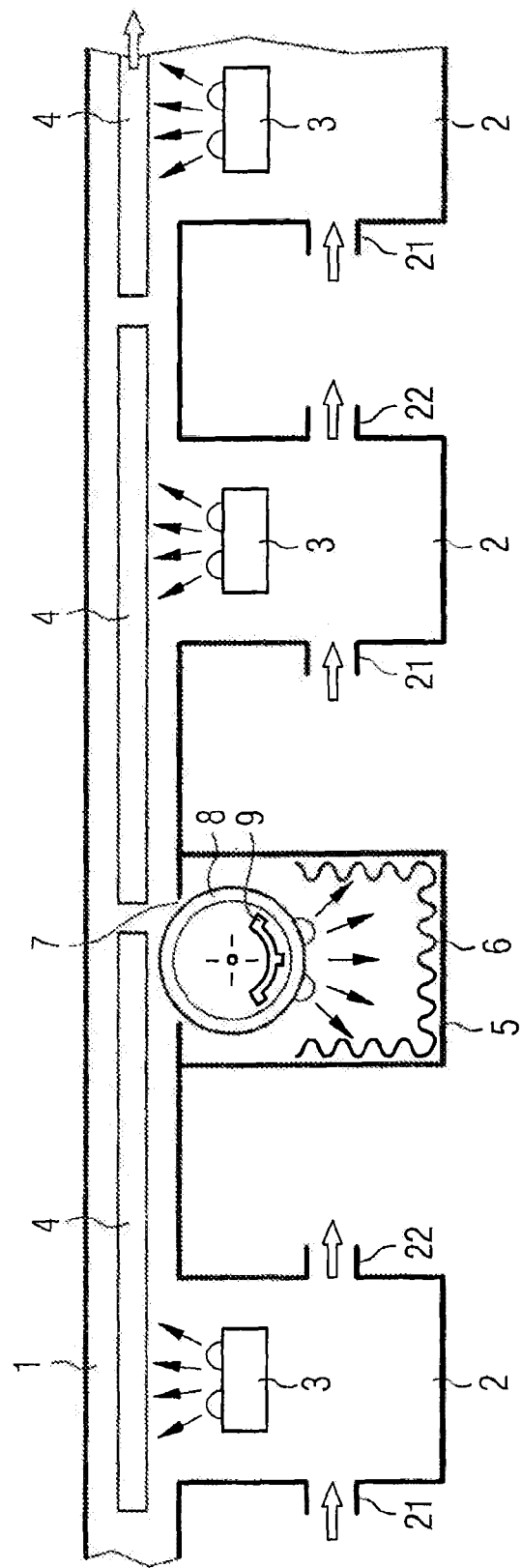

GETTER PUMP AND VACUUM COATING INSTALLATION COMPRISING A GETTER PUMP

CROSS REFERENCE TO RELATED APPLICATIONS

This application is a national stage filing under section 371 of International Application No. PCT/EP2007/056773, filed on Jul. 4, 2007, and published in German on Jan. 10, 2008, as WO 2008/003724, and which claims priority of German application No. 10 2006 031 440.9, filed on Jul. 5, 2006, the entire disclosure of these applications being hereby incorporated herein by reference.

BACKGROUND ART

The invention relates to a getter pump, in particular for use inside the vacuum chamber of a vacuum coating installation, as well as a vacuum coating installation having a getter pump of this type.

A getter is a chemically reactive material which is used for the purpose of maintaining a vacuum as long as possible or also generating a vacuum. Gas molecules form a compound with the atoms of the getter material on the surface of a getter. Gas molecules are captured in this way. This principle is used, for example, for binding residual gases remaining in the vacuum. The gas precipitates on fresh, uncovered surfaces. If the layer is formed by vapor deposition of a metal, one refers to getter pumps. Titanium is usually used in the getter pumps of vacuum technology. Platinum is also suitable.

In vacuum coating installations for the deposition of alternating layer systems made of chemical compounds, often oxides, and metals and simultaneous layer deposition, a very effective gas separation of the processing gas atmospheres of the various coating processes is necessary. If this separation, which is often referred to as gas separation, is not provided, there is a clear degradation of the properties of the metal layers.

Typical applications are the production of highly reflective mirrors, the vapor deposition of alternating layer systems made of oxidic, nitridic, and metallic layers for implementing heat protection functions, and the production of cermet layers. Cermets (from the English words ceramic and metal) are composite materials made of ceramic materials in a metallic matrix (binder). They are distinguished by an especially high hardness and wear resistance.

Gas separation units typically comprise a combination of flow resistances and pumps. For higher demands on the degree of separation, differentially pumped separation stages are used. Turbo-molecular pumps or diffusion pumps are typically used.

Geometric limits also apply from a technical aspect for the flow resistances, so that the individual conductances may not be set arbitrarily small. A higher degree of separation thus requires a very high suction performance for the reactive processing gases. Geometric limitations also result here on the one hand, and cost limitations result on the other hand.

So-called getter pumps are a very effective type for suctioning reactive gases. Metal electrodes are atomized in a glow discharge process. The freshly deposited metal layers adsorb, i.e., getter, incident reactive gas particles and thus act as the pump. Because new material is continuously atomized, this process may be continuously maintained. In the limiting case, getter pumps may achieve an area-related suction performance which corresponds to the conductance of a screen opening in the molecular flow range. However, this is only true if the getter surface faces directly toward the gas flow.

In conventionally constructed systems, however, this is not the case. The reason for this is that the substrates to be coated are typically to be protected before the vapor deposition of the metal vapor used for the sorption. Examples of systems of this type are the devices known from JP 2001/234326 and U.S. Pat. No. 5,980,213. A disadvantage of conventional apparatuses is the only indirect access of the reactive gas to the getter surfaces, which limits the efficiency of such an apparatus.

A device is known from JP 7138739, in which a coating chamber 1 and a vaporization chamber 2 are connected to one another by a valve 8. The substrate 5 to be coated is situated in the coating chamber 1. The vaporization chamber 2 is divided by a screen 10 into two partial chambers connected to one another. A first vapor source 3 for coating the substrate 5 is situated in one partial chamber and a second vapor source 4 for vaporizing the getter material is situated in the other partial chamber. It is not possible to prevent getter material from precipitating on the substrate in this device.

To solve this problem, it is suggested in JP 5001664 that a getter pump 4 having a getter pump housing 5 be situated on an opening of the wall 13 of a vacuum chamber 1 in such a way that a rotor 6 partially projects into the getter pump housing 5 and partially into the vacuum chamber 1. A titanium sphere 8, which is gradually atomized, is situated in the getter pump housing 5. The getter material atomized from the titanium sphere 8 precipitates on the rotor 6, i.e., the rotor 6 is solely used as a carrier for the getter material. By the rotation of the rotor 6, the layer of getter material deposited thereon is moved into the vacuum chamber 1. A disadvantage of this solution is that the rotor 6 must be replaced after a certain operating time, because the deposited layer becomes thicker and thicker. Shutdown times, which cause costs, arise in this way. In addition, the danger exists that getter material will penetrate between the rotor 6 and the opening of the wall 13 of the vacuum chamber 1 into the vacuum chamber 1 and contaminate the substrate in this way, because the material atomized from the titanium sphere 8 is emitted in this direction.

BRIEF SUMMARY OF INVENTION

Proceeding from this prior art, one object of the present invention comprises specifying a getter pump which has a high efficiency and a low need for maintenance. A further object of the invention comprises specifying a vacuum coating installation in whose vacuum chamber an ultrahigh vacuum may be generated, the substrate to be coated not being contaminated by atomized getter material.

The getter pump according to the invention, which is particularly suitable for use inside the vacuum chamber of a vacuum coating installation, comprises a getter pump housing having an exposure opening and, in the getter pump housing, a getter body made of getter material, which essentially closes the exposure opening and is situated so it is movable in relation to the exposure opening, an internal partial area of the surface of the getter body pointing into the getter pump housing and an external partial area of the surface of the getter body pointing out of the getter pump housing through the exposure opening, and the positions of the internal and external partial areas of the surface of the getter body being exchangeable by moving the getter body, and is characterized in that an ablation unit is provided for ablating getter material from the internal partial area of the surface of the getter body.

In contrast to the prior art, in the getter pump according to the invention, the getter body from which the getter material is atomized is positioned in front of the exposure opening, so that except for a small gap, no connection exists between the interior of the getter pump housing and the surroundings. In other words: the body which essentially closes the exposure opening comprises getter material itself. The atomization of getter material occurs from the internal partial area of the surface of the getter body. The atomized getter material is thus emitted into the interior of the getter pump housing, i.e., away from the exposure opening. The atomized getter material binds gas molecules and contaminants which reach the interior of the getter pump housing in certain circumstances through the gap between the getter body and the delimitation of the exposure opening.

By the movement of the getter body, during which the internal partial area and the external partial area of its surface exchange their positions, the internal partial area of the surface, which is cleaned by the atomization of getter material, becomes the external partial area of the surface, so that this cleaned partial area lies outside the getter pump housing and may be used there for the adsorption of gas molecules and contaminants. The movement of the getter body in the meaning of this application may comprise, for example, that an endless, flexible strip made of getter material, or made of rigid segments of getter material which are connected to one another so they are movable, or made of a flexible carrier material, on which rigid segments of getter material are situated, is transported revolving around two return rollers. Other forms of the movement of the getter body are also included by the invention, of course, it solely being important that an internal partial area of the surface of the getter body exchanges its position with an external partial area of the surface of the getter body.

In one design of the invention, it is provided that the getter body is mounted so it is rotatable. A rotation of the getter body is made possible in this way, whereby the outlay for apparatus for implementing the mobility of the getter body may be kept low.

In particular with a rotatably mounted getter body, it is advantageous for the surface of the getter body to be cylindrical. The gap between the getter body and the delimitation of the exposure opening may permanently be kept very low in this way, so that the probability that gas molecules or contaminants enter the getter pump housing is very small. In addition, a cylindrical getter body has a low installation space requirement and a favorable ratio of surface and volume.

The ablation unit is advantageously a magnet system situated in the interior of the getter body. On the one hand, it is thus possible to keep the getter pump housing small and thus achieve a compact construction for the getter pump according to the invention. On the other hand, the ablation unit is thus itself protected from the precipitation of atomized getter material. Finally, this design especially advantageously allows the atomized getter material to be emitted away from the exposure opening.

In a refinement of the invention, at least one wall of the getter pump housing is implemented as a secondary getter surface. This means that the wall of the getter pump housing is implemented as conductive and is at anode potential in relation to the getter body, i.e., is grounded, for example, if the getter body lies at negative high-voltage potential, so that the atomized getter material precipitates on the wall. A further getter surface, which binds gas molecules and contaminants in the interior of the getter pump housing, arises in the interior of the getter pump housing in this way.

It may advantageously be provided that at least one secondary getter surface element is removably fastened to at least one wall of the getter pump housing. In this way, the wall of the getter pump housing is not coated, but rather the atomized getter material precipitates on the getter surface element. Because the getter surface element is removably fastened, it may easily be replaced with a new getter surface element, when a specific layer thickness is reached.

To increase the pump performance, it may be provided that at least two getter bodies are provided. Of course, it is also possible to provide an even higher number of getter bodies. However, the paired configuration of getter bodies provides further advantages in particular.

It is thus provided in a refinement of the invention that two adjacent getter bodies are drivable in opposing rotational directions. In this way, the surface areas of the two getter bodies running past one another are always both freshly cleaned or both contaminated. In contrast, the operation of adjacent getter bodies with the same rotational direction would result in a freshly cleaned surface of one getter body being moved past the contaminated surface of the other getter body. A further advantage of the operation with opposing rotational directions results from the fact that the drive may be significantly simplified.

For example, it may be provided that a shared drive unit is provided for moving at least two getter bodies. For operation using opposing rotational directions, a coupling may be produced between the drive unit and the two getter bodies in a simple way in that the getter bodies each have a gear wheel on one end, the two gear wheels being engaged with one another, and the drive unit, such as an electric motor, which also has a gear wheel, drives one of the two getter bodies.

A further advantage of the paired use of getter bodies in regard to their operation may be achieved in that each two getter bodies are operable using AC voltage having opposing polarization. On the one hand, the overall voltage supply of the getter pumps may be greatly simplified in relation to DC voltage operation, on the other hand, arc discharges, so-called arcs, because of the accumulation of insulating layers on the getter bodies, are effectively avoided.

The vacuum coating installation comprising a vacuum chamber according to the invention comprises at least one getter pump of the type described above. The use of the getter pump according to the invention in a vacuum coating installation allows an ultrahigh vacuum to be generated and the substrate to be simultaneously protected from the coating with getter material.

The getter pump is advantageously situated on or in the vacuum chamber in such a way that the external partial area of the surface of the getter body points into the interior of the vacuum chamber. In other words: the getter pump according to the invention may be mounted as a whole inside the vacuum chamber. Alternatively, it is possible to provide an exposure opening in the wall of the vacuum chamber, via which the getter pump housing is connected vacuum-tight to the wall of the vacuum chamber. The latter variant has the advantage that the getter body is externally accessible and is thus easier to maintain.

In an especially advantageous way, the getter pump according to the invention may be used for gas separation in a vacuum coating installation, in which the vacuum chamber comprises at least two sequentially situated processing chambers for performing various technological steps, the processing chambers being connected to one another in such a way that a substrate to be coated is transportable through all processing chambers in operation of the vacuum coating installation if it is provided that the getter pump is situated between two sequentially situated processing chambers. The getter pump situated between two processing chambers ensures that the processing gases used in two adjacent processing chambers, such as an inert gas and a reactive gas, may not penetrate into the particular other processing chamber and interfere with the method step executed therein. Gas molecules which, coming from one processing chamber, move through the connection between the processing chambers toward the other processing chamber, are captured by the getter pump located between the processing chambers.

BRIEF DESCRIPTION OF THE DRAWING FIGURES

The invention is explained in greater detail hereafter on the basis of an exemplary embodiment and an associated drawing.

The single FIGURE shows an exemplary longitudinal section through a vacuum coating installation having multiple processing chambers situated one after another.

DETAILED DESCRIPTION

A vacuum coating installation comprising a vacuum chamber 1, which has multiple processing chambers 2 situated one after another, is shown in the FIGURE. The vacuum coating installation is used for coating planar substrates 4, such as glass panes, with a so-called alternating layer system, i.e., a multilayer coating, in which the different layers comprise different coating materials. A coating unit 3 is situated in each processing chamber 2 for this purpose. In the exemplary embodiment, the coating units 3 in the processing chambers 2 are formed as magnetrons, i.e., as a combination of a target which comprises the coating material or a component of the coating material, and a magnet system.

Because of the differing natures of the various layers to be produced, it is necessary to feed a different processing gas, such as an inert gas or a reactive gas, into each processing chamber 2. For this purpose, gas inlets 21 and gas outlets 22 are provided on the processing chambers 2. Because the processing chambers 2 are connected to one another, so that the substrates 4 may be transported in sequence through all processing chambers 2, the danger exists that the processing gas from one processing chamber 2 will reach an adjacent processing chamber 2. To prevent the negative effects on the quality of the coating connected thereto, a getter pump according to the invention is situated in the exemplary embodiment between two adjacent processing chambers 2, which comprises a getter pump housing 5 having secondary getter surfaces 6 and an exposure opening 7, a hollow-cylindrical getter body 8 made of getter material, which is mounted so it is rotatable, and, as an ablation unit, a magnet system 9 situated in the interior of the getter body, having a power supply connected to the getter body to generate a gas discharge plasma, by which getter material is ablated from the getter body.

The magnet system 9 is situated in the interior of the getter body 8 in such a way that the magnetic field originating therefrom has the result that getter material is atomized from the internal partial area of the surface of the getter body 8, i.e., from the partial area which is located in the interior of the getter pump housing 5, and is emitted away from the exposure opening 7 of the getter pump housing 5. A cleaned surface is permanently provided by the atomization of getter material from the internal partial area of the getter body 8, which exclusively comprises atomic getter material and is moved out of the getter pump housing 5, i.e., into the vacuum chamber 1, by rotation of the getter body 8 using a drive unit (not shown).

The operation of the getter pump according to the invention has two effects: firstly, the fresh, cleaned surface binds gas molecules and contaminants which are located in the vacuum chamber 1 in the area of the substrate 4 when it becomes an external partial area of the surface of the getter body 8 by rotation of the getter body 8. In this way, the getter pump fulfills the object of performing a gas separation between two adjacent processing chambers 2. Secondly, both the cloud of atomized getter material inside the getter pump housing 5 and also the secondary getter surfaces 6 also located therein bind gas molecules which reach the interior of the getter pump housing 5 through the gap between the getter body 8 and the exposure opening 7.

In the exemplary embodiment described, the core part of the getter pump is very similar to sputter sources, from which material is atomized to coat a substrate. This sputter source is an atomization source having a tubular target, the zone of the atomization being influenced by the orientation of an internal magnet system. In contrast to the use of a conventional sputter source, however, the orientation of the vapor stream is directed away from the substrate.

This principle allows the generation of a fresh metal surface in the atomization area on the target which faces away from the substrate running through the separation gap, i.e., through the tunnel connecting the two adjacent processing chambers. A continuous rotation of this fresh surface in the separation gap ensures a direct access of the gas flow to the getter surface, without a coating of the substrate running in the channel being caused.

To increase the effectiveness of the configuration, secondary getter surfaces 6 are provided opposite to the racetrack, i.e., opposite to the internal partial area of the surface of the getter body 8 from which getter material is momentarily being ablated. Those gas molecules which enter the geometric gap between target tube and flow baffles, i.e., between getter body 8 and exposure opening 7, accumulate on these secondary getter surfaces 6.

The suction power of the getter pump is set in that a defined electrical power is fed into the magnetron discharge. It is thus possible to adapt the suction power to the requirements of the process control in the coating installation.

In order that the getter pump is usable over the entire pressure range typically occurring in PVD installations, the magnet system 9 is implemented in such a way that it generates a magnetic field having a horizontal component of approximately 60-70 mT (at most) on the surface of the getter body 8.

The use of the tubular magnetron principle results in an extraordinarily high service life of the getter body 8 of the getter pump. A material which has a low sputter rate is preferably used for the atomization target. Materials of this type are titanium and zirconium, for example.

The parallel operation of processes which were possible up to this point only in cyclic installations or in processing chambers 2 of installations of this type separated by valve chambers is made possible by the use of the getter pump described in vacuum coating installations.

The invention claimed is:

1. A getter pump for use inside a vacuum chamber of a vacuum coating installation, comprising a getter pump housing having an exposure opening and, in the getter pump housing, a getter body which essentially closes the exposure opening and is situated so the body is movable in relation to the exposure opening, said body being made of getter material, an internal partial area of a surface of the getter body facing into the getter pump housing and an external partial area of the surface of the getter body extending through the exposure opening out of the getter pump housing, and positions of the internal and external partial areas of the surface of the getter body being exchangeable by moving the getter body, and further comprising an ablation unit ablating getter material from the internal partial area and not from the external partial area of the surface of the getter body.

2. The getter pump according to claim 1, wherein the getter body is mounted so the body is rotatable.

3. The getter pump according to claim 1, wherein the surface of the getter body is cylindrical.

4. The getter pump according to claim 1, wherein the ablation unit comprises a magnet system situated in an interior of the getter body, and a power supply unit, connected to the getter body, for igniting a gas discharge plasma.

5. The getter pump according to claim 1, wherein at least one wall of the getter pump housing comprises a secondary getter surface.

6. The getter pump according to claim 1, wherein at least one secondary getter surface element is removably fastened to at least one wall of the getter pump housing.

7. The getter pump according to claim 1, wherein at least two getter bodies are provided.

8. The getter pump according to claim 7, wherein two adjacent getter bodies are drivable in opposing rotational directions.

9. The getter pump according to claim 7, further including a shared drive unit for moving the at least two getter bodies.

10. The getter pump according to claim 7, wherein each two getter bodies are operable using AC voltage having opposing polarization.

11. A vacuum coating installation having a vacuum chamber, comprising at least one getter pump according to claim 1.

12. The vacuum coating installation according to claim 11, wherein the getter pump is situated in such a way that the external partial area of the surface of the getter body extends into an interior of the vacuum chamber.

13. The vacuum coating installation according to claim 11, wherein the vacuum chamber comprises at least two sequentially situated processing chambers for performing various technological steps, the processing chambers being connected to one another in such a way that a substrate to be coated is transportable through all processing chambers in operation of the vacuum coating installation, and the getter pump is situated between two sequentially situated processing chambers.

14. A getter pump for use inside a vacuum chamber of a vacuum coating installation, comprising a getter pump housing having an exposure opening and, in the getter pump housing, a getter body which essentially closes the exposure opening and is situated so the body is movable in relationship to the exposure opening, said body being made of getter material, a first partial area of a surface of the getter body facing away from the exposure opening and into the getter body housing, and a second partial area of the surface of the getter body facing the exposure opening, and positions of the first and second partial areas of the surface of the getter body being exchangeable by moving the getter body, and further comprising an ablation unit ablating getter material from the first partial area and not from the second partial area of the surface of the getter body.

* * * * *